(12) United States Patent
Srinivasan et al.

(10) Patent No.: US 8,377,718 B2
(45) Date of Patent: Feb. 19, 2013

(54) METHODS OF FORMING A CRYSTALLINE $PR_{1-x}CA_xMNO_3$ (PCMO) MATERIAL AND METHODS OF FORMING SEMICONDUCTOR DEVICE STRUCTURES COMPRISING CRYSTALLINE PCMO

(75) Inventors: Bhaskar Srinivasan, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/943,370

(22) Filed: Nov. 10, 2010

(65) Prior Publication Data

US 2012/0112151 A1    May 10, 2012

(51) Int. Cl.
*H01L 21/20* (2006.01)
(52) U.S. Cl. ...... 438/3; 438/104; 438/689; 257/E21.459
(58) Field of Classification Search .............. 438/3, 104; 257/2
See application file for complete search history.

(56) References Cited

U.S. PATENT DOCUMENTS

| | | | |
|---|---|---|---|
| 5,019,205 A | 5/1991 | Endl et al. | |
| 6,204,139 B1 * | 3/2001 | Liu et al. | 438/385 |
| 6,774,054 B1 * | 8/2004 | Zhang et al. | 438/781 |
| 6,911,361 B2 | 6/2005 | Zhang et al. | |
| 6,939,724 B2 * | 9/2005 | Zhuang et al. | 438/3 |
| 6,955,992 B2 | 10/2005 | Zhang et al. | |
| 7,045,840 B2 * | 5/2006 | Tamai et al. | 257/295 |
| 7,060,586 B2 | 6/2006 | Li et al. | |
| 7,098,101 B1 | 8/2006 | Li et al. | |
| 7,205,238 B2 | 4/2007 | Pan et al. | |
| 7,259,387 B2 * | 8/2007 | Kawazoe et al. | 257/2 |
| 7,276,175 B2 | 10/2007 | Otabe | |
| 7,309,616 B2 * | 12/2007 | Nagashima et al. | 438/3 |
| 7,402,456 B2 * | 7/2008 | Zhuang et al. | 438/100 |
| 7,407,858 B2 * | 8/2008 | Li et al. | 438/261 |
| 7,755,093 B2 | 7/2010 | Ohara | |
| 2005/0136602 A1 | 6/2005 | Hsu et al. | |
| 2005/0239262 A1 * | 10/2005 | Zhuang et al. | 438/385 |
| 2005/0245039 A1 * | 11/2005 | Li et al. | 438/385 |
| 2005/0270821 A1 * | 12/2005 | Nakano | 365/145 |
| 2006/0281277 A1 * | 12/2006 | Tamai et al. | 438/385 |
| 2007/0131538 A1 | 6/2007 | Nagashima | |
| 2008/0266931 A1 * | 10/2008 | Tang et al. | 365/148 |
| 2009/0039338 A1 * | 2/2009 | Suh et al. | 257/4 |
| 2009/0097300 A1 * | 4/2009 | Ishihara et al. | 365/148 |
| 2009/0102597 A1 * | 4/2009 | Ishihara | 338/20 |
| 2009/0250678 A1 * | 10/2009 | Osano et al. | 257/2 |
| 2009/0283736 A1 * | 11/2009 | Kanzawa et al. | 257/2 |
| 2011/0006275 A1 * | 1/2011 | Roelofs et al. | 257/2 |

OTHER PUBLICATIONS

Levy et al., Stress Tuning in Crystal Ion Slicing to Form Single-Crystal Potassium Tantalate Films, Applied Physics Letters, vol. 77, No. 14, Oct. 2, 2000, pp. 2124-2126.

Sinnamon et al., Investigation of Dead-Layer Thickness in SrRuO3/Ba0.5Sr0.5TiO3/Au Thin-Film Capacitors, Applied Physics Letters, Vo. 78, No. 12, pp. 1724-1726, Mar. 19, 2001.

Takeshima et al., Thickness Dependence of Characteristics for (Ba,Sr)TiO3 Thin Films Perpared by Metalorganic Chemical Vapor Deposition, Jpn. J. Appl. Phys., Sep. 2000, vol. 39, Part 1, No. 9B, pp. 5389-5392.

* cited by examiner

*Primary Examiner* — Savitr Mulpuri
(74) *Attorney, Agent, or Firm* — TraskBritt

(57) ABSTRACT

A method of forming a crystalline $Pr_{1-x}Ca_xMnO_3$ (PCMO) material includes forming an amorphous PCMO material, crystallizing the amorphous PCMO material, and removing a portion of the crystalline PCMO material. A semiconductor structure including the crystalline PCMO material is also disclosed where the crystalline PCMO material has a thickness of less than about 50 nm. A method of forming a semiconductor device structure is also disclosed.

21 Claims, 3 Drawing Sheets

METHODS OF FORMING A CRYSTALLINE $PR_{1-x}CA_xMNO_3$ (PCMO) MATERIAL AND METHODS OF FORMING SEMICONDUCTOR DEVICE STRUCTURES COMPRISING CRYSTALLINE PCMO

TECHNICAL FIELD

Embodiments of the present disclosure relate to semiconductor memory fabrication and, more specifically, to methods for forming a crystalline $Pr_{1-x}Ca_xMnO_3$ (PCMO) material on a semiconductor device structure, and to related semiconductor device structures.

BACKGROUND

As conventional semiconductor memory, such as Flash memory and dynamic random access memory (DRAM), reach their scaling limits, research has focused on commercially viable low power, low operation voltage, high-speed, and high-density non-volatile memory devices. One example of such a non-volatile memory device is a variable resistance memory device including a programmable resistive memory material formed from a material exhibiting a very large negative magnetoresistance, often referred to as a so-called "colossal magnetoresistance" (CMR) material. The CMR material may be connected to a current controlling device, such as a diode, a field effect transistor (FET), or a bipolar junction transistor (BJT).

The resistance of the CMR material remains constant until a high electric field induces current flow through the CMR material, resulting in a change in the CMR resistance. During a programming process, the resistivity of the memory resistor at the high field region near the electrode changes first. Experimental data show that the resistivity of the material at the cathode is increased while that at the anode is decreased. During an erase process, the pulse polarity is reversed. That is, the designation of cathode and anode are reversed. Then, the resistivity of the material near the cathode is decreased, and the resistivity near the anode is increased.

One example of a CMR material is a manganese oxide of the general formula $R_{1-x}M_xMnO_3$, wherein R is a rare earth element, M is a metal (e.g., calcium, strontium, or barium), and x is a number from about 0.05 to about 0.95. The CMR material is often referred to as "CMR manganites." CMR manganites exhibit reversible resistive switching properties, which may be used for low power, low operation voltage, high-speed, and high-density memory applications.

PCMO is a CMR manganite that is currently being investigated for its potential use in variable resistance memory devices. Amorphous PCMO may be deposited using a variety of methods, such as physical vapor deposition (PVD), metal-organic chemical vapor deposition (MOCVD), spin-coating, and pulsed laser deposition. However, amorphous PCMO is not able to provide the requisite resistive switching for use in a variable resistance memory device. The resistive switching characteristics of PCMO have been shown to improve as the PCMO reaches a crystalline phase. In addition, amorphous PCMO is not well-suited for use in variable resistance memory devices because a poor yield is obtained. To convert amorphous PCMO to the crystalline phase, the amorphous PCMO may be exposed to temperatures of greater than about 400° C. For example, after depositing the amorphous PCMO using a conventional chemical vapor deposition (CVD) process, an annealing process is performed that converts the amorphous PCMO to crystalline PCMO, by exposing the amorphous PCMO to a temperature of about 525° C. Alternatively, an MOCVD process may be performed at increased temperatures (i.e., about 600° C.) to form the crystalline PCMO. However, PCMO materials formed at temperatures greater than 550° C. may exhibit decreased resistive switching characteristics. In addition, the high deposition temperature and high anneal temperature may damage other features of the variable resistance memory device, such as metal wiring and interconnects.

Variable resistance memory devices conventionally include a thin layer of crystalline PCMO, such as a crystalline PCMO layer having a thickness of less than about 50 nm. However, direct formation or growth of a PCMO layer that is both thin and crystalline is difficult to achieve because the crystallization utilizes a high temperature anneal, which may damage other components of the variable resistance memory device. The direct formation of the thin crystalline PCMO layer also affects its crystallization kinetics, which affects the properties of the resulting thin crystalline PCMO layer or avoids interfacial reactions with a bottom material of the variable resistance memory device. The resulting thin crystalline PCMO layer also causes significant stress in the variable resistance memory device.

It would be desirable to be able to produce PCMO materials that are both crystalline and thin (having a thickness of less than about 50 nm) for use in semiconductor memory devices.

DETAILED DESCRIPTION

As used herein, the term "PCMO" means and includes a compound having the general formula $Pr_{1-x}Ca_xMnO_3$, wherein x is a number of from about 0.05 to about 0.95. Examples of stoichiometries for PCMO include, but are not limited to, $Pr_{0.7}Ca_{0.3}MnO_3$, $Pr_{0.5}Ca_{0.5}MnO_3$, and $Pr_{0.67}Ca_{0.33}MnO_3$.

As used herein, the term "thin" means and includes a material having a thickness of less than about 50 nm.

As used herein, the term "thick" means and includes a material having a thickness of greater than or equal to about 50 nm.

The following description provides specific details, such as material types and processing conditions, in order to provide a thorough description of embodiments of the present disclosure. However, a person of ordinary skill in the art would understand that the embodiments of the present disclosure may be practiced without employing these specific details. Indeed, the embodiments of the present disclosure may be practiced in conjunction with conventional semiconductor fabrication techniques employed in the industry. In addition, the description provided below does not form a complete process flow for manufacturing a semiconductor device, i.e., the semiconductor device structures described below do not form a complete semiconductor device. Only those process acts and structures necessary to understand the embodiments of the present disclosure are described in detail below. Additional acts to form a complete semiconductor device from the semiconductor device structures may be performed by conventional semiconductor fabrication techniques.

Methods for forming a thin PCMO material, semiconductor device structures including the same, and methods of forming the semiconductor device structures are disclosed. In particular, the methods may be used to form a desired thickness of a PCMO material having a crystalline structure, which is referred to herein as so-called "crystalline PCMO." The thickness of the crystalline PCMO material may be less than about 50 nm, such as from about 5 nm to about 35 nm. The methods may include forming a relatively thick, amorphous PCMO material over a substrate of the semiconductor device structure. The thickness of the amorphous PCMO material may be greater than about 50 nm. Due to the increased thickness, the amorphous PCMO material may be easily crystallized since the thick, amorphous PCMO material is crystallized at a lower temperature than that utilized to crystallize a conventional amorphous PCMO material formed at a thickness of less than about 50 nm. A portion of the crystalline PCMO material may then be removed to produce the thin crystalline PCMO material of the semiconductor device structure.

Figure 1:
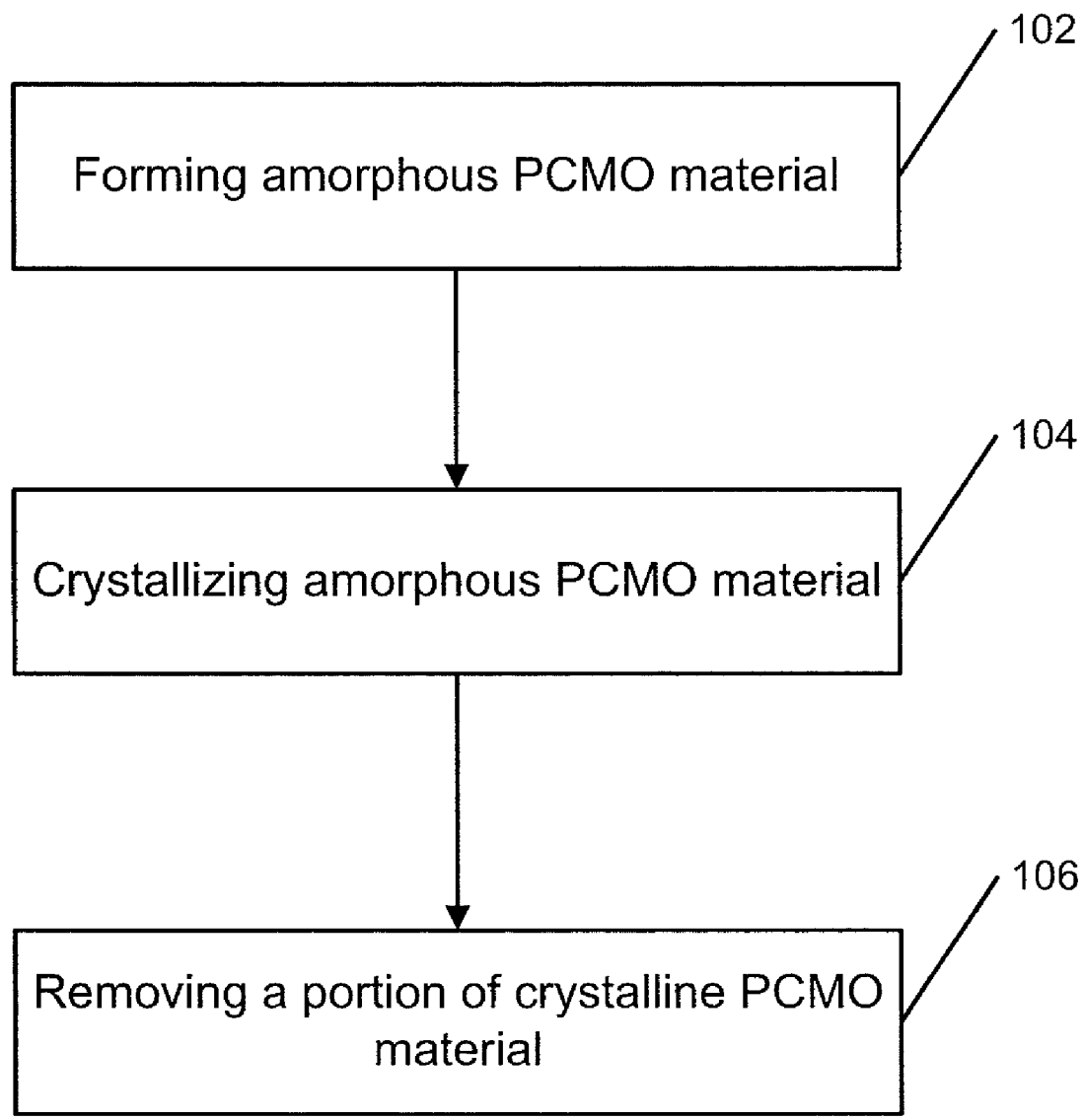
FIG. 1 is a flow diagram illustrating a method of forming a crystalline PCMO material over a substrate in accordance with embodiments of the disclosure.

FIG. 1 is a flow diagram illustrating an embodiment of a method of forming a thin crystalline PCMO material on a semiconductor device structure. As shown in FIG. 1, forming amorphous PCMO material 102 may be followed by crystallizing amorphous PCMO material 104. These acts may be followed by removing a portion of crystalline PCMO material 106 to produce the thin crystalline PCMO material, which has the desired thickness of less than about 50 nm.

Forming amorphous PCMO material 102 on the substrate may include any conventional process for depositing or growing a PCMO material, such as PVD, MOCVD, spin-coating, pulsed laser deposition, atomic layer deposition (ALD), etc. The amorphous PCMO material may be formed as a layer or other three-dimensional configuration on the substrate. By way of example, the amorphous PCMO material may be blanket deposited on the substrate, or may be deposited in trenches or other openings in the substrate.

The amorphous PCMO material may be formed on the substrate under conditions (e.g., temperature, environment) in which problems associated with forming conventional thin crystalline PCMO films, such as oxidation and impurities, are limited. The amorphous PCMO material may be formed at a thickness greater than the thickness of the crystalline PCMO material ultimately desired. By way of example, the amorphous PCMO material may be formed at an initial thickness of from about 50 nm to about 150 nm. By forming the amorphous PCMO material at a greater thickness, the amorphous PCMO material may be formed under a wide range of conditions, such as at a lower temperature. For instance, forming amorphous PCMO material 102 may be conducted at a temperature of less than about 600° C., such as a temperature of less than about 550° C., less than about 500° C., less than about 450° C., less than about 400° C., or less than about 350° C. At a temperature above 600° C., a crystalline PCMO material may, undesirably, be formed. Forming amorphous PCMO material 102 at a lower temperature may produce the amorphous PCMO material with less contamination from oxidation products or other impurities.

Following the forming of amorphous PCMO material 102, methods of the disclosure may include crystallizing the amorphous PCMO material 104. Crystallizing amorphous PCMO material 104 may include subjecting the amorphous PCMO material to heat, which converts the amorphous PCMO material to a crystalline phase. For example, the amorphous PCMO material may be heated to a temperature between about 400° C. and about 600° C. The amorphous PCMO material may be heated for an amount of time sufficient to convert the amorphous PCMO material to its crystalline phase, such as from about 3 minutes to about 60 minutes. The exposure time may depend on the thickness of the amorphous PCMO material, the environment, the crystallization temperature, and the properties of the underlying substrate (e.g., geometry, composition, etc.). In some embodiments, the amorphous PCMO material may be heated for from about 3 minutes to about 60 minutes, such as from about 3 minutes to about 20 minutes or from about 3 minutes to about 15 minutes.

The temperature and amount of time utilized to crystallize the amorphous PCMO material may depend on the thickness of the amorphous PCMO material. However, since the thickness of the amorphous PCMO material is greater than or equal to about 50 nm, the temperature to which the amorphous PCMO material is exposed may be lower than the temperature utilized to directly form a conventional, thin crystallized PCMO material. Due to the thickness of the amorphous PCMO material, stress within the amorphous PCMO material near the surface of the substrate may also be relieved. By utilizing a lower temperature, damage to the substrate and exposed components formed in or on the substrate may be minimized or prevented, while crystallization of the amorphous PCMO material is still achieved. For example, utilizing a lower temperature may limit or prevent melting, deformation, delamination, or other damage to the substrate or other features of the semiconductor device structure, such as electrodes, through-wafer interconnects, lines, traces, wiring, or vias.

The amorphous PCMO material may be crystallized in a non-oxidizing environment or an oxidizing environment. The non-oxidizing environment may include an inert gas, such as nitrogen, argon, helium, neon, krypton, xenon, any other non-reactive gases, or combinations thereof. The oxidizing environment may include oxygen ($O_2$), ozone ($O_3$), nitric oxide (NO), nitrogen dioxide ($NO_2$), nitrous oxide ($N_2O$), combinations thereof, or combinations of at least one of these oxidizing agents with a non-reactive gas. However, if an oxidizing environment is used for the crystallization, oxidation of the PCMO material may occur, which may lead to the presence of impurities in the crystalline PCMO material.

After crystallizing the amorphous PCMO material 104, removing a portion of the crystalline PCMO material 106 may occur. A desired thickness of the crystalline PCMO material may be removed by an abrasive planarization process, an isotropic etch process (e.g., a wet etch process), or any other suitable removal technique. One example of an abrasive planarization process is chemical-mechanical polishing (CMP). The technique for removing the portion of the crystalline PCMO material may depend on the amount of crystalline PCMO material to be removed and the location of the crystalline PCMO material on the semiconductor device structure. The thickness of the crystalline PCMO material may be reduced from its initial thickness to a final thickness of from about a few monolayers to about 35 nm, such as a final thickness of from about 5 nm to about 30 nm.

If the amorphous PCMO material is blanket deposited on the substrate, the portion of the crystalline PCMO material may be removed by the abrasive planarization process, such as CMP, to produce a relatively smooth or planar surface on the crystalline PCMO material. The CMP process utilized may be a conventional CMP process that utilizes a conventional CMP abrasive, a conventional slurry, and a conventional polishing pad. Therefore, the details of the CMP process are not described in detail herein.

If the amorphous PCMO material is deposited in trenches or other openings in the substrate, an abrasive planarization process may not be an effective method of removing the desired portion of the crystalline PCMO material. Therefore, in such situations, the desired portion of the crystalline PCMO material may be removed by an isotropic etch process, which may limit or prevent ion damage to the crystalline PCMO material by avoiding the mechanical abrasion associated with the abrasive planarization process. The isotropic etch process may include applying a wet etchant to the crystalline PCMO material. The wet etchant may be an aqueous solution that includes an additive, such as ammonium fluoride, nitric acid, hydrochloric acid, hydrofluoric acid, phosphoric acid, other acids, or combinations thereof. The concentration of additive in the wet etchant may be determined by a person of ordinary skill in the art and, therefore, is not described in detail herein. The isotropic etch process may be selective for the crystalline PCMO material (i.e., may react at a faster rate with the crystalline PCMO material than with other exposed materials on the substrate). The crystalline PCMO material may be subjected to the isotropic etch process for an amount of time sufficient to remove the desired amount of the crystalline PCMO material. The isotropic etch process may be terminated once the desired amount of the crystalline PCMO material has been removed.

Forming a thin crystalline PCMO material as described above with reference to FIG. 1 may result in a crystalline PCMO material having the desired properties and a better defect yield than a conventional thin crystalline PCMO material deposited directly on a substrate. That is, the incidence of defects in the thin crystalline PCMO material formed according to embodiments of the present disclosure may be lower than in substrates over which a thin layer of crystalline PCMO material is directly deposited.

Figure 2:
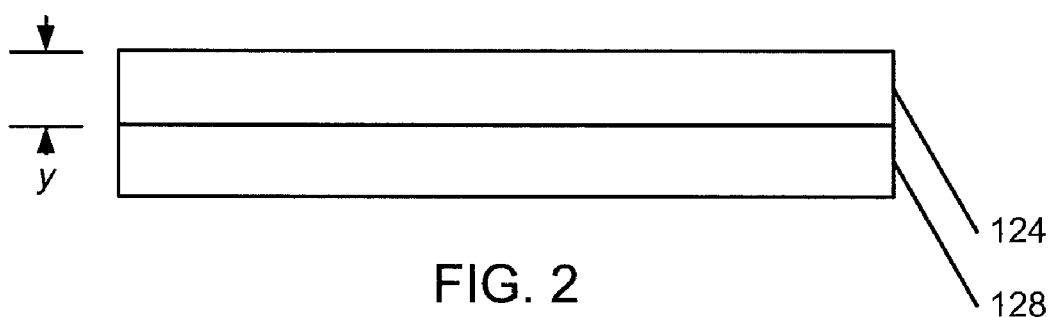
FIGS. 2 through 6 are schematics illustrating methods of forming a semiconductor device in accordance with embodiments of the disclosure.
Figure 3:
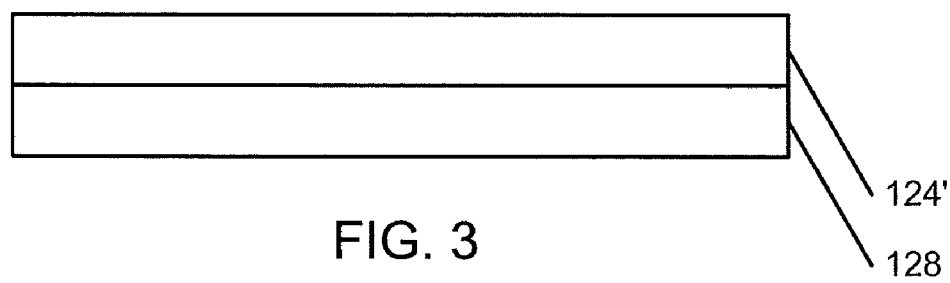
Figure 4:
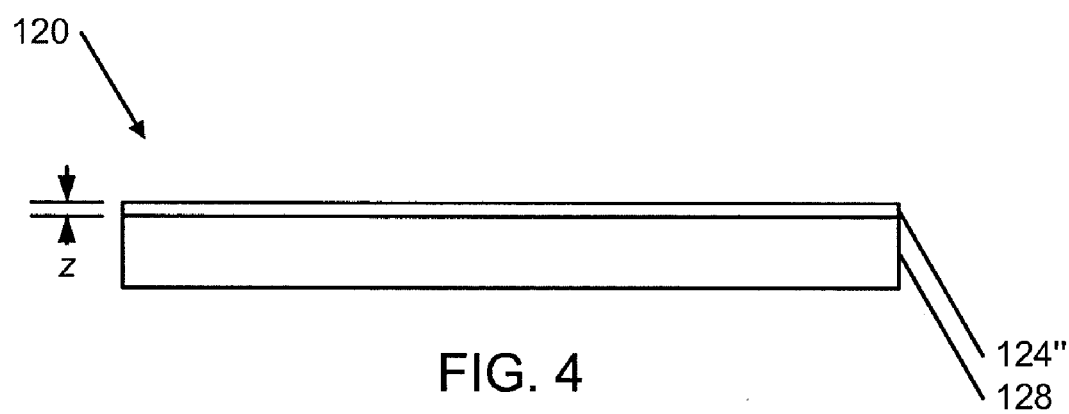

FIGS. 2 through 4 illustrate a method of forming a semiconductor device structure 120 (FIG. 4) including a thin crystalline PCMO material 124" (FIG. 4) that may be formed according to embodiments of the present disclosure. As shown in FIG. 2, an amorphous PCMO material 124 may be formed on a substrate 128. The substrate 128 may be a conventional silicon substrate or other bulk substrate having a layer of semiconductor material. As used herein, the term "bulk substrate" includes not only silicon wafers, but also silicon-on-insulator (SOI) substrates, silicon-on-sapphire (SOS) substrates, epitaxial layers of silicon on a base semiconductor foundation, and other semiconductor or optoelectronics materials, such as silicon-germanium, germanium, gallium arsenide, or indium phosphide. Optionally, at least one feature (not shown in FIGS. 2-4), such as an electrode, through-wafer interconnect, line, trace, wiring, or via, may be formed on, over, or in the substrate 128. Such a feature may be formed by conventional semiconductor fabrication techniques, which are not described in detail herein. In one embodiment, the substrate 128 is a doped polysilicon material and includes an electrode therein, as described in more detail in reference to FIGS. 5 and 6.

By way of example, the amorphous PCMO material 124 may be formed on the substrate 128 by PVD, MOCVD, ALD, spin-coating, or pulsed laser deposition. To form the amorphous PCMO material 124 on the substrate 128, the substrate 128 may be placed in a chamber of a deposition tool or other equipment (not shown) configured to form the amorphous PCMO material 124. As previously described, the amorphous PCMO material 124 may be formed at a temperature of less than about 600° C. The amorphous PCMO material 124 may be formed at a desired thickness "y," which is greater than the thickness "z" of the thin crystalline PCMO material 124" on the semiconductor device structure 120 (FIG. 4).

Once the amorphous PCMO material 124 has been formed on the substrate 128, the amorphous PCMO material 124 may be crystallized to form a crystalline PCMO material 124', as shown in FIG. 3. The crystalline PCMO material 124' may be produced by, for example, exposing the amorphous PCMO material 124 to heat, such as in the chamber of the deposition tool. The chamber may include the non-oxidizing environment or oxidizing environment. The chamber may be maintained at a temperature between about 400° C. and about 600° C. for between about 3 minutes and about 60 minutes, to crystallize the amorphous PCMO material 124 as described above. By selecting a crystallization temperature that is lower than a temperature utilized to directly form a conventional thin PCMO film, damage to the substrate 128 and any exposed components formed thereon may be avoided, although the amorphous PCMO material 124 may still be effectively crystallized to the crystalline PCMO material 124'.

After crystallization of the amorphous PCMO material 124, a portion of the crystalline PCMO material 124' may be removed, forming the thin crystalline PCMO material 124", as shown in FIG. 4. The portion of the crystalline PCMO material 124' may be removed as described above. The removal process may be conducted in the same chamber of the same deposition tool in which the amorphous PCMO material 124 was formed. Alternatively, the removal process may be conducted in a chamber of a second different tool, such as by transferring the substrate 128 having the crystalline PCMO material 124' thereon, to the second, different tool.

Forming the thin crystalline PCMO material 124" by the methods described with reference to FIGS. 2 through 4 may result in the thin crystalline PCMO material 124" exhibiting a better defect yield than conventional thin crystallized PCMO materials, which are directly deposited. That is, the incidence of defects in the thin crystalline PCMO material 124", formed according to embodiments described herein, may be lower than in conventional thin crystallized PCMO materials deposited in crystalline form.

Figure 5:
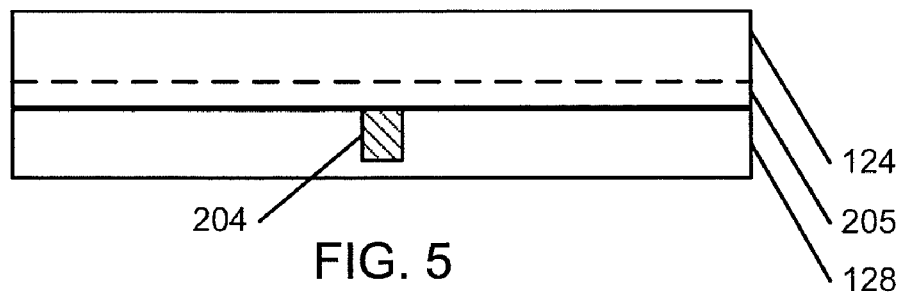
Figure 6:
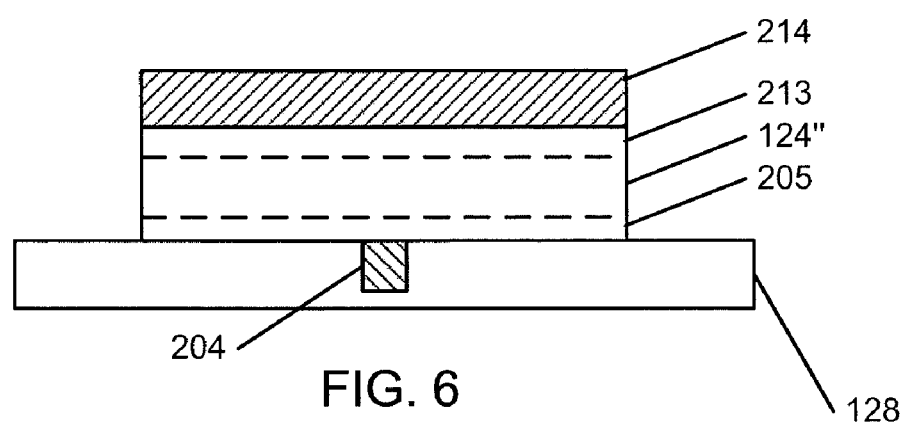

The semiconductor device structure 120 having the thin crystallized PCMO material 124" (FIG. 4) may be present in a memory cell, such as in a variable resistance memory cell 212, as shown in FIG. 6. As shown in FIG. 5, an intermediate structure 200 that may be used to form variable resistance memory cell 212 (FIG. 6), may be formed that includes a first electrode 204 in the substrate 128 and, optionally, an oxide material 205 (shown in dashed lines) overlying the substrate 128. As a non-limiting example, the substrate 128 may be a doped polysilicon material. The first electrode 204 may be formed from a conductive material, such as copper, tungsten, nickel, tantalum, titanium, titanium nitride, aluminum, platinum, or alloys thereof. The first electrode 204 may be formed using conventional semiconductor fabrication processes known in the art, which are not described in detail herein. The oxide material 205 may be formed from a rare earth metal oxide, such as zirconia ($ZrO_x$), yttrium oxide ($YO_x$), erbium oxide ($ErO_x$), gadolinium oxide ($GdO_x$), lanthanum aluminum oxide ($LaAlO_x$), and hafnium oxide ($HfO_x$) using a conventional deposition process, such as a CVD process or an ALD process.

The amorphous PCMO material 124 may be formed on the surface of the substrate 128 or the surface of the oxide material 205 (if present). The amorphous PCMO material 124 may be crystallized and a portion of the crystalline PCMO material 124' removed, as previously described. As shown in FIG. 6, a second electrode 214 and, optionally, another oxide material 213 (shown in dashed lines), may be formed over the thin crystalline PCMO material 124" to produce the variable resistance memory cell 212. If present, the oxide material 213 may be formed from one of the rare earth metal oxide materials described above. The second electrode 214 may include a conductive material and may be formed over the thin crystalline PCMO material 124" using conventional semiconductor fabrication techniques, which are not described in detail herein.

CONCLUSION

In one embodiment, the present disclosure includes a method of forming a crystalline PCMO material. The method comprises forming an amorphous PCMO material, crystallizing the amorphous PCMO material, and removing a portion of the crystalline PCMO material.

In another embodiment, the present disclosure includes a semiconductor device structure that comprises a crystalline PCMO material on a substrate. The crystalline PCMO material is produced by forming an amorphous PCMO material on the substrate, crystallizing the amorphous PCMO material, and removing a portion of the crystalline PCMO material such that a thickness of the crystalline PCMO material is less than about 50 nm.

In yet another embodiment, the present disclosure includes a method of forming a semiconductor device structure. The method comprises forming at least one feature in a substrate, forming an amorphous PCMO material on the substrate, heating the amorphous PCMO material to form a crystalline PCMO material, and removing a portion of the crystalline PCMO material.

While the invention is susceptible to various modifications and alternative forms, specific embodiments have been shown, by way of example, in the drawings and have been described in detail herein. However, the invention is not intended to be limited to the particular forms disclosed. Rather, the invention is to cover all modifications, equivalents, and alternatives falling within the scope of the invention as defined by the following appended claims and their legal equivalents.

What is claimed is:

1. A method of forming a crystalline $Pr_{1-x}Ca_xMnO_3$ (PCMO) material, comprising:
forming an amorphous $Pr_{1-x}Ca_xMnO_3$ (PCMO) material having a first thickness, wherein x is a number from about 0.05 to about 0.95;
crystallizing the amorphous PCMO material by heating; and
removing a portion of the crystalline PCMO material to leave a crystalline PCMO material having a second thickness, the second thickness smaller than the first thickness.

2. The method of claim 1, wherein forming an amorphous PCMO material comprises depositing the amorphous PCMO material at a temperature below about 600° C.

3. The method of claim 1, wherein forming an amorphous PCMO material comprises forming the amorphous PCMO material at a thickness of from about 50 nm to about 150 nm.

4. The method of claim 1, wherein crystallizing the amorphous PCMO material comprises heating the amorphous PCMO material to a temperature of between about 400° C. and about 600° C.

5. The method of claim 1, wherein crystallizing the amorphous PCMO material comprises heating the amorphous PCMO material to a temperature of between about 400° C. and about 500° C.

6. The method of claim 1, wherein crystallizing the amorphous PCMO material comprises heating the amorphous PCMO material to a temperature of about 450° C.

7. The method of claim 1, wherein crystallizing the amorphous PCMO material comprises heating the amorphous PCMO material in a non-oxidizing environment.

8. The method of claim 1, wherein removing a portion of the crystalline PCMO material comprises isotropically etching the crystalline PCMO material.

9. The method of claim 1, wherein removing a portion of the crystalline PCMO material comprises removing the portion of the crystalline PCMO material by an abrasive planarization process.

10. The method of claim 1, wherein removing a portion of the crystalline PCMO material comprises reducing a thickness of the crystalline PCMO material to a thickness between about 5 nm and about 35 nm.

11. The method of claim 1, wherein removing a portion of the crystalline PCMO material comprises reducing a thickness of the crystalline PCMO material to about 10nm.

12. A method of forming a semiconductor device structure, comprising:
forming an amorphous $Pr_{1-x}Ca_xMnO_3$ (PCMO) material having a first thickness on a substrate, wherein x is a number from about 0.05 to about 0.95;
heating the amorphous PCMO material to form a crystalline PCMO material;
removing a portion of the crystalline PCMO material to leave a crystalline PCMO material having a second thickness, the second thickness smaller than the first thickness; and
forming at least one of an electrode, a through-wafer interconnect, a line, a trace, a wire, and a via in or on the substrate.

13. The method of claim 12, wherein removing a portion of the crystalline PCMO material comprises isotropically etching the crystalline PCMO material.

14. The method of claim 12, wherein removing a portion of the crystalline PCMO material comprises exposing the crystalline PCMO material to an aqueous solution comprising ammonium fluoride, nitric acid, hydrochloric acid, hydrofluoric acid, phosphoric acid, or a combination thereof.

15. The method of claim 12, wherein removing a portion of the crystalline PCMO material comprises subjecting the crystalline PCMO material to an abrasive planarization process.

16. The method of claim 12, wherein forming an amorphous PCMO material on the substrate comprises forming the amorphous PCMO material at a thickness of between about 50 nm and about 150 nm.

17. The method of claim 12, wherein removing a portion of the crystalline PCMO material comprises reducing a thickness of the crystalline PCMO material to a thickness between about 5 nm and about 35 nm.

18. The method of claim 12, wherein forming an amorphous PCMO material on the substrate comprises depositing the amorphous PCMO material as a layer.

19. The method of claim 12, wherein forming an amorphous PCMO material on the substrate comprises depositing the amorphous PCMO material in trenches in the substrate.

20. The method of claim 12, wherein removing a portion of the crystalline PCMO material comprises removing a portion of the crystalline PCMO material without forming a discontinuity in the crystalline PCMO material.

21. A method of forming a semiconductor device structure, comprising:
 forming a continuous Pr1-xCaxMnO3 (PCMO) material on a substrate, wherein x is a number from about 0.05 to about 0.95, wherein forming the continuous PCMO material comprises:
  forming an amorphous PCMO material on the substrate;
  heating the amorphous PCMO material to form a crystalline PCMO material; and removing a horizontal continuous portion of the crystalline PCMO material.

* * * * *

UNITED STATES PATENT AND TRADEMARK OFFICE
CERTIFICATE OF CORRECTION

PATENT NO. : 8,377,718 B2
APPLICATION NO. : 12/943370
DATED : February 19, 2013
INVENTOR(S) : Bhaskar Srinivasan et al.

It is certified that error appears in the above-identified patent and that said Letters Patent is hereby corrected as shown below:

In the Claims:

In column 7, line 43, in Claim 1, delete "Pr1-xCaxMnO3" and insert -- $Pr_{1-x}Ca_xMnO_3$ --, therefor.

In column 7, line 45, in Claim 1, delete "Pr1-xCaxMnO3" and insert -- $Pr_{1-x}Ca_xMnO_3$ --, therefor.

In column 8, line 21, in Claim 11, delete "10nm." and insert -- 10 nm. --, therefor.

In column 8, line 24, in Claim 12, delete "Pr1-xCaxMnO3" and insert -- $Pr_{1-x}Ca_xMnO_3$ --, therefor.

In column 9, line 3, in Claim 21, delete "Pr1-xCaxMnO3" and insert -- $Pr_{1-x}Ca_xMnO_3$ --, therefor.

Signed and Sealed this
Fourteenth Day of May, 2013

Teresa Stanek Rea
*Acting Director of the United States Patent and Trademark Office*